United States Patent [19]

Horiuchi

[11] Patent Number: 4,906,055
[45] Date of Patent: Mar. 6, 1990

[54] VOLTAGE LEVEL JUDGING DEVICE

[75] Inventor: Hiroyuki Horiuchi, Nara, Japan

[73] Assignee: Sharp Kabushiki Kaisha, Osaka, Japan

[21] Appl. No.: 380,712

[22] Filed: Jul. 12, 1989

Related U.S. Application Data

[63] Continuation of Ser. No. 173,757, Mar. 28, 1988, abandoned.

[30] Foreign Application Priority Data

Apr. 2, 1987 [JP] Japan ................................. 62-81928

[51] Int. Cl.[4] .................... G01N 27/46; G05F 1/46
[52] U.S. Cl. .................................. 307/354; 324/433;
324/426; 320/48; 340/636; 307/350; 307/362
[58] Field of Search ............... 307/350, 352, 354, 362,
307/364; 320/48; 324/426, 427, 433, 435;
340/636, 661, 663; 323/349, 281, 275, 284, 285

[56] References Cited

U.S. PATENT DOCUMENTS

| | | | |
|---|---|---|---|
| 4,020,414 | 4/1977 | Paredes | 324/433 |
| 4,080,560 | 3/1978 | Abert | 320/48 |
| 4,316,185 | 2/1982 | Watrous et al. | 324/433 |
| 4,410,766 | 10/1983 | Beirne | 323/284 X |
| 4,445,090 | 4/1984 | McCocik et al. | 320/48 |
| 4,521,735 | 6/1985 | Kageyama et al. | 324/426 |
| 4,684,877 | 8/1987 | Shreve et al. | 307/299.3 X |
| 4,698,578 | 10/1987 | Mullersman et al. | 307/66 X |
| 4,709,200 | 11/1987 | Ochiai | 307/64 X |
| 4,774,450 | 9/1988 | Kitamura | 307/66 X |

Primary Examiner—Stanley D. Miller
Assistant Examiner—Timothy P. Callahan
Attorney, Agent, or Firm—Flehr, Hohbach, Test, Albritton & Herbert

[57] ABSTRACT

A device for determining whether a source voltage from a power source to be applied to a load such as an electrical apparatus is below a standard level but above a specified level or below this specified level includes a voltage divider circuit for dividing the source voltage, a single voltage level detection circuit for comparing an inputted voltage, a transistor switch with which the source voltage or the output voltage from the voltage divider circuit is selectably inputted to the voltage level detection circuit, and a central processing unit for controlling the operation of the transistor switch according to the result of detection by the voltage level detection circuit.

7 Claims, 2 Drawing Sheets

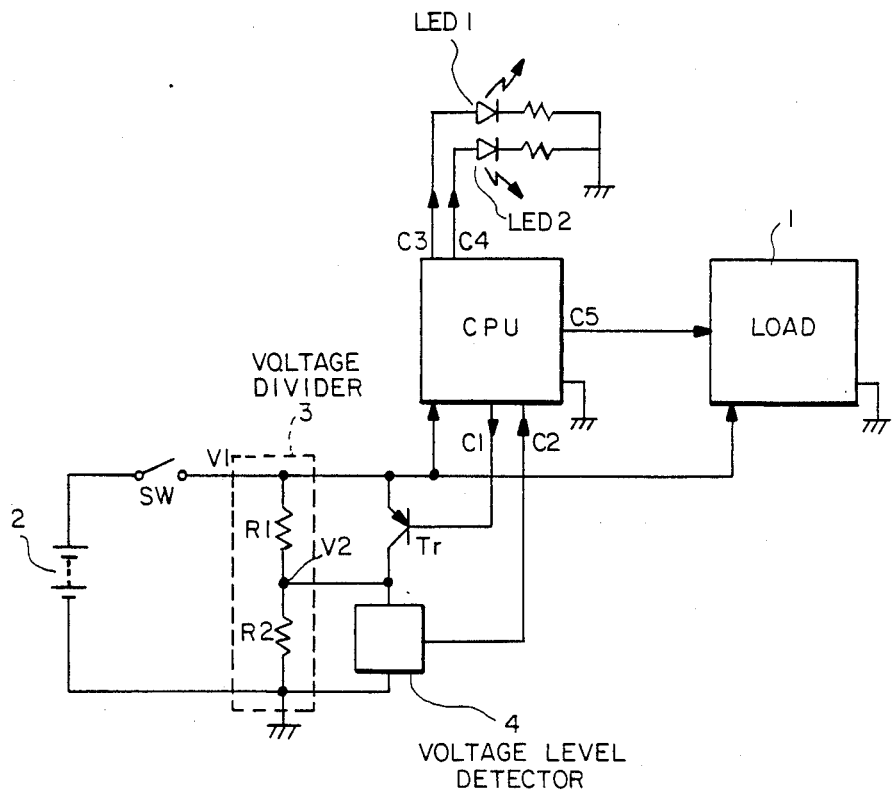
FIG.—1

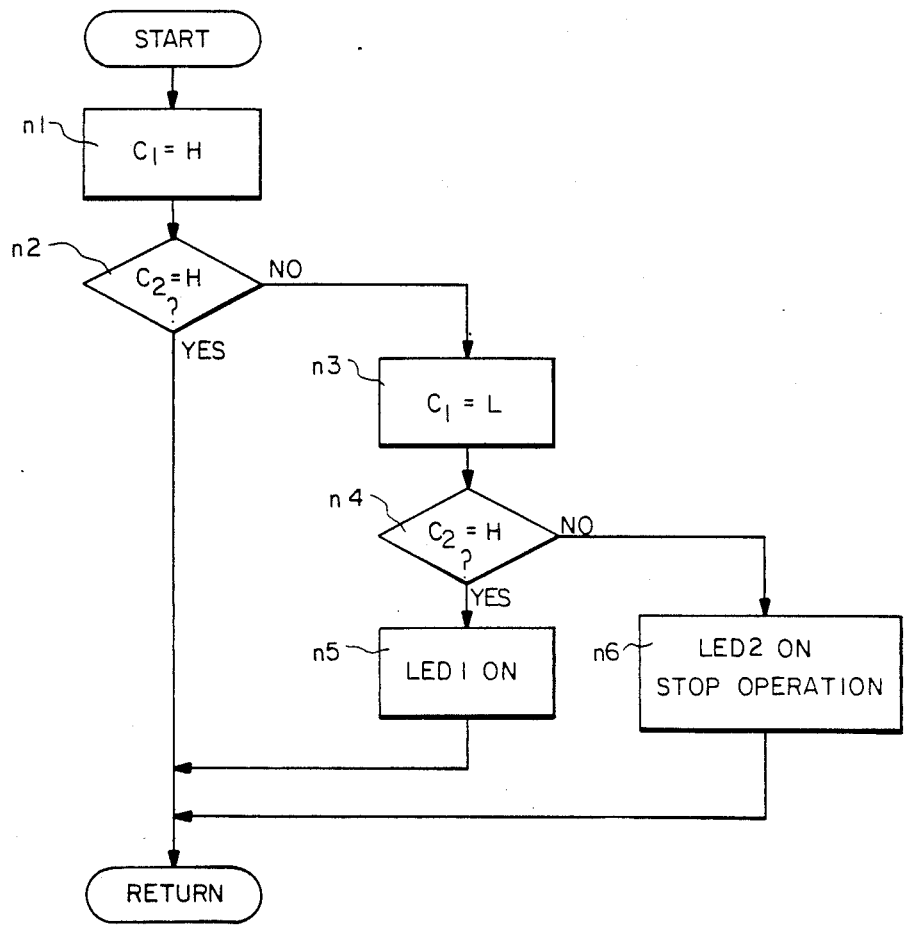
FIG.—2

VOLTAGE LEVEL JUDGING DEVICE

This is a continuation of application Ser. No. 173,757 filed Nov. 28, 1988.

BACKGROUND OF THE INVENTION

This invention relates to a voltage level judging device for informing the user whether the time has come to exchange or recharge a power source such as a battery for an electrical apparatus.

Among electrical apparatus requiring a power source such as a battery for supplying a voltage of a specified level, there are those which are provided with means for giving the user a warning when the voltage level of such a power source drops to a predetermined level. Among the warning devices of this type, there are those designed to switch on a yellow warning lamp if the voltage level of the source being monitored is below its standard level but above a certain specified level and to switch on a red lamp and stop the operation of the apparatus if the source voltage is below this specified level. In order to output two such warning signals according to two separate criteria, prior art devices of this type use two voltage level detection circuits to compare the source voltage with two reference levels but, if use must be made of two voltage level detection circuits, the associated peripheral circuits become complicated and the apparatus as a whole becomes expensive to manufacture.

SUMMARY OF THE INVENTION

It is therefore an object of the present invention to provide a voltage level judging device which is of a simple structure and hence inexpensive to manufacture.

The above and other objects of the present invention are achieved by providing a voltage level judging device which is for determining whether the voltage level of a source for supplying power to an electrical apparatus or the like is below a standard level but above a specified level or below this specified level and is characterized as comprising a voltage divider circuit for dividing the source voltage, a single voltage level detection circuit for detecting both the output voltage level from this voltage divider circuit and the voltage level of the power source, switching means for selectively applying to this voltage level detection circuit either the output voltage from this voltage divider circuit or the power source voltage and a control circuit for carrying out the ON-OFF control of the switching means on the basis of an output signal from the voltage level detection circuit. With a voltage level judging device thus structured, the control circuit switches on and off the switching means to selectively apply to the voltage level detection circuit either the source voltage or the output voltage from the voltage divider circuit and the source voltage is compared with two reference levels by this single voltage level detection circuit. Since a single circuit for voltage detection is used according to the present invention, the associated peripheral circuits can be simplified and the production cost of the device can be reduced.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a block diagram schematically showing the structure of a voltage level judging device embodying the present invention, and FIG. 2 is a flow chart for the operation of the device of the present invention shown in FIG. 1.

DETAILED DESCRIPTION OF THE INVENTION

A voltage level judging device embodying the present invention is described next by way of FIGS. 1 and 2 wherein numeral 1 indicates a load such as an electrical apparatus to which a source voltage is applied from a power source 2 such as a battery and of which the operation is controlled by a central processing unit CPU. The source 2 is connected both to the load 1 and to the central processing unit CPU through a source switch SW. Numeral 3 indicates a voltage divider circuit for dividing the source voltage $V_1$ of the source 2. The voltage divider circuit 3 is composed of two resistors $R_1$ and $R_2$ and its output voltage $V_2$ is therefore $R_2V_1/(R_1+R_2)$. Resistance values $R_1$ and $R_2$ are both variable and hence the output voltage $V_2$ can be selectably set by varying $R_1$ and $R_2$.

Numeral 4 indicates a voltage level detection circuit for separately detecting both the source voltage $V_1$ and the output voltage $V_2$ from the voltage divider circuit 3. The voltage level detection circuit 4 is connected between the junction point of the two resistors $R_1$ and $R_2$ of the voltage divider circuit 3, or its output terminal, and the grounding terminal of the source 2, and serves to determine whether the source voltage $V_1$ and the output voltage $V_2$ from the voltage divider circuit 3 are respectively above a certain reference level or not.

A PNP-type transistor Tr is provided as a switching means for selectably applying the source voltage $V_1$ of the power source 2 and the output voltage $V_2$ from the voltage divider circuit 3. The collector of this transistor Tr is connected to the voltage level detection circuit 4, its emitter is connected to the source line of the power source 2 and its base is connected to the central processing unit CPU. Thus, when this transistor Tr is in the ON condition, the source voltage $V_1$ of the power source 2 is applied to the voltage level detection circuit 4 and when the transistor Tr is switched to the OFF condition, the output voltage $V_2$ from the voltage divider circuit 3 is applied to the voltage level detection circuit 4. The central processing CPU serves not only to output a control signal $C_1$ to control the condition of the transistor Tr but also to continue the operation of the load 1 and to carry out the ON-OFF control of light emitting diodes $LED_1$ and $LED_2$ for emitting yellow light and red light respectively, on the basis of a detection signal $C_2$ from the voltage level detection circuit 4.

With reference next to FIG. 2 which is a flow chart of the operation of the device shown in FIG. 1, or more particularly that of the central processing unit CPU, when a high voltage (H) drive signal $C_1$ is outputted from the central processing unit CPU to the base of the transistor Tr (n1), the transistor Tr is placed in a non-conductive condition and this causes the output voltage $V_2$ from the voltage divider circuit 3 to be applied to the voltage level detection circuit 4. Th voltage level detection circuit 4 thereupon compares the voltage $V_2$ now being applied thereto with a specified voltage level. If the voltage $V_2$ being applied is found to be equal to or above this specified voltage level, a high voltage (H)

detection signal $C_2$ is transmitted to the central processing unit CPU. If the central processing unit CPU recognizes this detection signal $C_2$ as a high voltage signal (YES in n2), it is concluded that the source voltage $V_1$ of the power source 2 is within the allowable voltage range according to the specification of the load 1 and the central processing unit CPU outputs a drive signal $C_5$ to the load 1 to continue its operation.

As the battery is consumed, the source voltage $V_1$ of the source 2 drops. If the output voltage $V_2$ from the voltage divider circuit 3 drops correspondingly and becomes lower than the specified level, the voltage level detection circuit 4 detects this situation and transmits a low voltage (L) detection signal $C_2$ to the central processing unit CPU. When this low voltage (L) detection signal $C_2$ is received by the central processing unit CPU (NO in n2), the central processing unit CPU transmits to the transistor Tr a low voltage (L) control signal $C_1$ (n3). The transistor Tr is thereby placed in a conductive condition and the source voltage $V_1$ of the power source 2 is directly applied to the voltage level detection circuit 4. As explained above, the voltage level detection circuit 4 transmits a high voltage (H) detection signal $C_2$ to the central processing unit CPU if the source voltage 1 at this time is equal to or above the specified level.

If the source voltage $V_1$ at this time is such that the central processing unit CPU receives a high voltage (H) detection signal from the voltage level detection circuit 4 (YES in n4), this means that the source voltage $V_1$ has dropped but still is high enough to be within the allowed range of voltage according to the specification of the load 1 such that there is no need to stop its operation. So, the central processing unit CPU thereupon transmits a drive signal $C_3$ to the yellow light emitting diode $LED_1$ to cause yellow light to be emitted, indicating that the load 1 is operating with a warning.

If the source voltage $V_1$ drops further such that the voltage level detection circuit 4 finds it below the specified level, a low voltage (L) detection signal $C_2$ is transmitted and when this is received by the central processing unit CPU (NO in n4), a drive signal $C_4$ is transmitted to the red light emitting diode $LED_2$ to cause red light to be emitted, indicating to the user that a source voltage $V_1$ is now below the allowable range of voltage according to the specification of the load 1. At the same time, the central processing unit CPU stops transmitting the drive signal $C_5$ to the load 1, thereby stopping its operation.

In summary, the voltage level judging device of the present invention employs a single voltage level detection circuit to compare the source voltage of a power source with two reference levels, causing yellow light to be emitted if the source voltage has dropped but is still within an allowable range according to the specification of the load and causing red light to be emitted and stopping the operation of the load if the source voltage has dropped below this allowable range of voltage. In other words, the number of voltage level detection circuits can be reduced according to the teaching of the present invention. The structure of the peripheral circuits can therefore be simplified and the manufacturing cost of the device can be reduced.

The foregoing description of a preferred embodiment of the invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be within the scope of this invention.

What is claimed is:

1. In a voltage level judging device connected to a power source outputting a source voltage and to a load for determining whether said source voltage from said power source is below a standard level but above a specified threshold voltage or below said threshold voltage, the improvement wherein said voltage level judging device comprises a voltage divider means for dividing said source voltage and thereby outputting a divided voltage which is a specified fraction of said source voltage, a single voltage level detection means for comparing an applied voltage with said threshold voltage and outputting an OK signal if said applied voltage is above said threshold voltage and a not-OK signal if said applied voltage is not above said threshold voltage, switching means for selectably causing said source voltage or said divided voltage to be applied to said voltage level detection means, and control means for controlling operation of said voltage level judging device, said control means continuing to operate said switching means so as to cause said divided voltage to be applied to said voltage level detection means as long as said voltage level detection means outputs said OK signal, said control means operating said switching means to cause said source voltage to be applied to said voltage level detection means if said voltage level detection means outputs said not-OK signal while said divided voltage is applied thereto, said control means outputting a first warning signal if said voltage level detection means outputs said OK signal while said source voltage is applied thereto, and said control means outputting a second warning signal different from said first warning signal if said voltage level detection means outputs said not-OK signal while said source voltage is applied thereto.

2. The device of claim 1 wherein said control means include a central processing unit.

3. The device of claim 1 further comprising a first light emitting diode with a first color and a second light emitting diode with a second color different from said first color, said first warning signal activating said first light emitting diode and said second warning signal activating said second light emitting diode.

4. The device of claim 1 wherein said switching means comprise a PNP-type transistor having a base, an emitter and a collector, said base being connected to said control means.

5. The device of claim 4 wherein said voltage divider means comprises a first junction, a second junction, a grounding junction, a first resistor connecting said first junction and said second junction, and a second resistor connecting said second junction and said grounding junction, said voltage divider means being connected to said power source such that said source voltage is applied between said first junction and said grounding junction.

6. The device of claim 5 wherein said emitter is connected to said first junction and said collector is connected to both said voltage level detection means and said second junction.

7. The device of claim 5 wherein said control means serves to stop operation of said load when said second warning signal is outputted.

* * * * *